United States Patent [19]
Lattimore et al.

[11] Patent Number: 5,953,745
[45] Date of Patent: Sep. 14, 1999

[54] REDUNDANT MEMORY ARRAY

[75] Inventors: George McNeil Lattimore, Austin; Terry Lee Leasure, Georgetown; Gus Wai-Yan Yeung, Austin, all of Tex.

[73] Assignee: International Business Machines Corporation, Armonk, N.Y.

[21] Appl. No.: 08/758,073

[22] Filed: Nov. 27, 1996

[51] Int. Cl.$^6$ .................................................. G06F 12/00
[52] U.S. Cl. ............................ 711/162; 711/120; 365/200
[58] Field of Search ........................... 371/10.2; 365/200; 395/182.06; 711/109, 114, 131

[56] References Cited

U.S. PATENT DOCUMENTS

| | | |
|---|---|---|
| 4,471,472 | 9/1984 | Young . |
| 4,523,313 | 6/1985 | Nibby, Jr. et al. ..................... 371/10.2 |
| 4,577,294 | 3/1986 | Brown et al. ............................. 365/200 |
| 4,601,019 | 7/1986 | Shah et al. ............................... 365/200 |
| 5,070,502 | 12/1991 | Supnik ................................. 395/182.06 |
| 5,255,227 | 10/1993 | Haeffele .................................. 365/200 |
| 5,257,229 | 10/1993 | McClure et al. ......................... 365/200 |
| 5,262,994 | 11/1993 | McClure et al. ......................... 365/200 |
| 5,265,054 | 11/1993 | McClure . |
| 5,355,340 | 10/1994 | Coker et al. . |
| 5,404,331 | 4/1995 | McClure . |
| 5,424,986 | 6/1995 | McClure . |
| 5,446,692 | 8/1995 | Haraguchi et al. . |
| 5,450,361 | 9/1995 | Iwahashi et al. . |
| 5,471,426 | 11/1995 | McClure . |
| 5,495,445 | 2/1996 | Proebsting ............................. 365/200 |
| 5,502,676 | 3/1996 | Pelley, III et al. . |
| 5,548,711 | 8/1996 | Brant et al. ........................ 395/182.03 |
| 5,646,896 | 7/1997 | Pinkham ................................. 365/200 |
| 5,673,227 | 9/1997 | Engles et al. ........................... 365/200 |

*Primary Examiner*—John W. Cabeca
*Assistant Examiner*—Fred F. Tzeng
*Attorney, Agent, or Firm*—Kelly K. Kordzik; Winstead, Sechrest & Minick P.C.; Anthony V.S. England

[57] ABSTRACT

A set associative cache memory array includes redundant memory portions for use in the case of a defective portion of the memory. Information is stored within the defective portion of the memory array and an identical copy is stored within the redundant portion. Additionally, reading of the information is done from both the defective portion and the redundant portion. Selection of the information from either the defective portion or the redundant portion is made using programmable circuitry such as a fuse.

20 Claims, 7 Drawing Sheets

REDUNDANT MEMORY ARRAY

CROSS-REFERENCE TO RELATED APPLICATIONS

Related subject matter may be found in the following commonly assigned, co-pending U.S. Patent Applications, both of which are hereby incorporated by reference herein:

Ser. No. 08/742,221, entitled "CACHE SUB-ARRAY METHOD AND APPARATUS FOR USE IN MICROPROCESSOR INTEGRATED CIRCUITS" filed Oct. 31, 1996, now U.S. Pat. No. 5,812,418, and Ser. No. 08/758,410, entitled "DATA PROCESSING SYSTEM HAVING MEMORY SUB-ARRAY REDUNDANCY AND METHOD THEREFOR", filed Nov. 27, 1996.

TECHNICAL FIELD

The present invention relates in general to semiconductor memories, and in particular, to the use of redundant memory arrays in semiconductor memories.

BACKGROUND INFORMATION

A memory is any device associated with a computer that is used to store information, such as programs or data, in digital form. Ever increasingly, newly developed software requires more and more memory in order to run efficiently and smoothly on a computer. It is well-known that one bit defect can ruin the operation of an entire program.

Many types of semiconductor memories, including static random access memories (SRAMs), dynamic random access memories (DRAMs), FIFOs, dual-port memories, and read-only memories of various types, fabricated as individual components and embedded in other integrated circuits such as microprocessors and other logic devices, are containing greater numbers of storage locations, and higher capacity, as the manufacturing technology improves.

For the general commercial market, such a memory is usable only if each and every storage location can be accessed and can store both digital data states. Failure of a single storage location, or bit, thus causes the entire memory (and logic device having an embedded memory) to be non-salable. Considering the relatively large chip size and high manufacturing costs for the high density memories noted hereinabove, such memories are particularly vulnerable to the effect of extremely small (in some cases submicron) defects that cause single "stuck" bits.

As a result, many semiconductor memories are now fabricated with redundant storage locations, which are enabled in the event of defects in the primary memory array. For ease of enabling, and also to address row or column defects, the redundant storage locations are generally formed as redundant rows or columns which, when enabled, replace an entire row or column of the primary memory array. The enabling of such redundant storage location is conventionally done during the manufacturing test process, where the primary memory is tested for functionality of the bits therein. The addresses of failing bits are logged, and an algorithm in the automated test equipment determines if the redundant rows or columns available on the circuit are sufficient to replace all of the failing bits. If so, fuses are opened (or, alternatively, anti-fuses may be closed) in the decoding circuitry of the memory so that the failing row or column is no longer enabled by its associated address value, and so that a redundant row or column is enabled by the address associated with the failing row or column.

Especially for high-performance memories, two competing constraints must be dealt with in the design of such redundant storage locations. A first of these constraints is the access time of the redundant storage locations relative to the access time of bits in the primary array. The performance of the computer depends on the speed of operation, which depends upon access times. Access of the redundant elements is typically slower than access of the bits in the primary array (or, at least, slower than the access time of bits in a similar design not utilizing redundancy).

As an example, in U.S. Pat. No. 5,301,153, to implement such redundancy requires the addition of a multiplexer into the critical access path, resulting in the added delay of the multiplexer.

A second constraint in the design of a memory with redundancy is the chip area required to incorporate the redundant elements and associated decode circuitry. The choice of the number of redundant rows and columns generally depends on an estimate of the types of defects which will be encountered in the manufacture of the memories, with the designer required to make a trade-off between the additional chip area required for redundancy and the expected number of otherwise failing circuits which can be repaired by redundancy.

It is therefore an object of this invention to provide a redundancy scheme which allows for efficient repairability without significant decrease in the performance of accesses to the redundant storage locations.

SUMMARY OF THE INVENTION

The foregoing need is addressed by the present invention which provides redundancy within a memory device whereby information stored within a first portion of the memory device may be copied into a redundant portion of the memory device for such instances where the first portion of the memory device is defective. The information is written to both portions of the memory device and is read from both portions of the memory device. Selection of information for writing and reading to and from the two portions of the memory device may be accomplished in response to a programmable fuse or some other type of programmable circuit, such as a register.

In one embodiment of the present invention, the memory device is a cache memory.

In another embodiment of the present invention, the memory device is a set associative cache memory device.

In another embodiment of the present invention, the memory portions represent bit slices of one or more bytes stored within the memory device.

In one particular embodiment of the present invention, a bit slice of a byte written into a sector of the memory circuit is also written into a redundant portion in response to a programmable fuse. The redundant portion and the main portion of the sector written into are both accessed by the same word line (in parallel) emanating from a word line decoder. The same information is read from the memory circuit with the use of a multiplexer, which chooses between the bit slice within the main sector and the bit slice of information within the redundant portion in response to the programmable fuse.

Prior art U.S. Pat. No. 5,301,153 uses a multiplexer to aid in selecting redundant memory arrays. However, the design disclosed in this prior art patent is not general enough to both aid in decoding the array and to add in the redundant path. Subsequently, the prior art has added delays by adding an additional multiplexer to the critical path. A distinguishing aspect of the present invention from this prior art is that the present invention combines the multiplexer for decoding and the multiplexer for redundancy into one unique structure. As a result, this design takes a standard multiplexer dynamic circuit and configures it at the next higher logic level to obtain a unique design. Therefore, no added access delay is incurred with the present invention.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
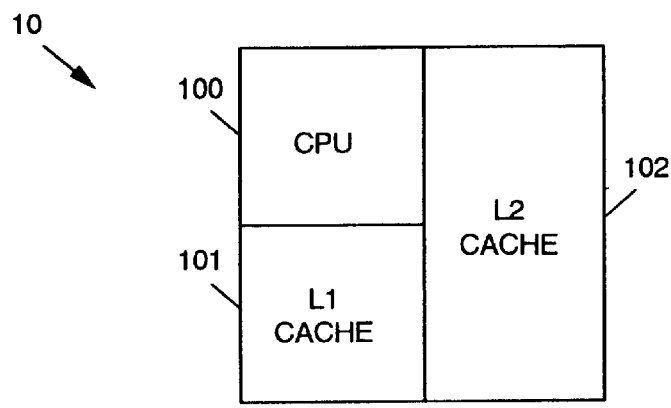
FIG. 1 illustrates an integrated circuit configured in accordance with the present invention.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring first to FIG. 1, there is illustrated integrated circuit ("chip") 10, which includes central processing unit ("CPU") 100 coupled to L1 (primary) cache 101 and L2 (secondary) cache 102. As will be discussed hereinafter, either or both of caches 101 or 102 may be configured in accordance with the present invention. However, the configuration of integrated circuit 10 is not meant to limit the various possible configurations for a memory circuit configured in accordance with the present invention. For example, a memory circuit in accordance with the present invention may be implemented on a chip alone or in combination with some other circuitry besides that shown in FIG. 1.

Figure 3:
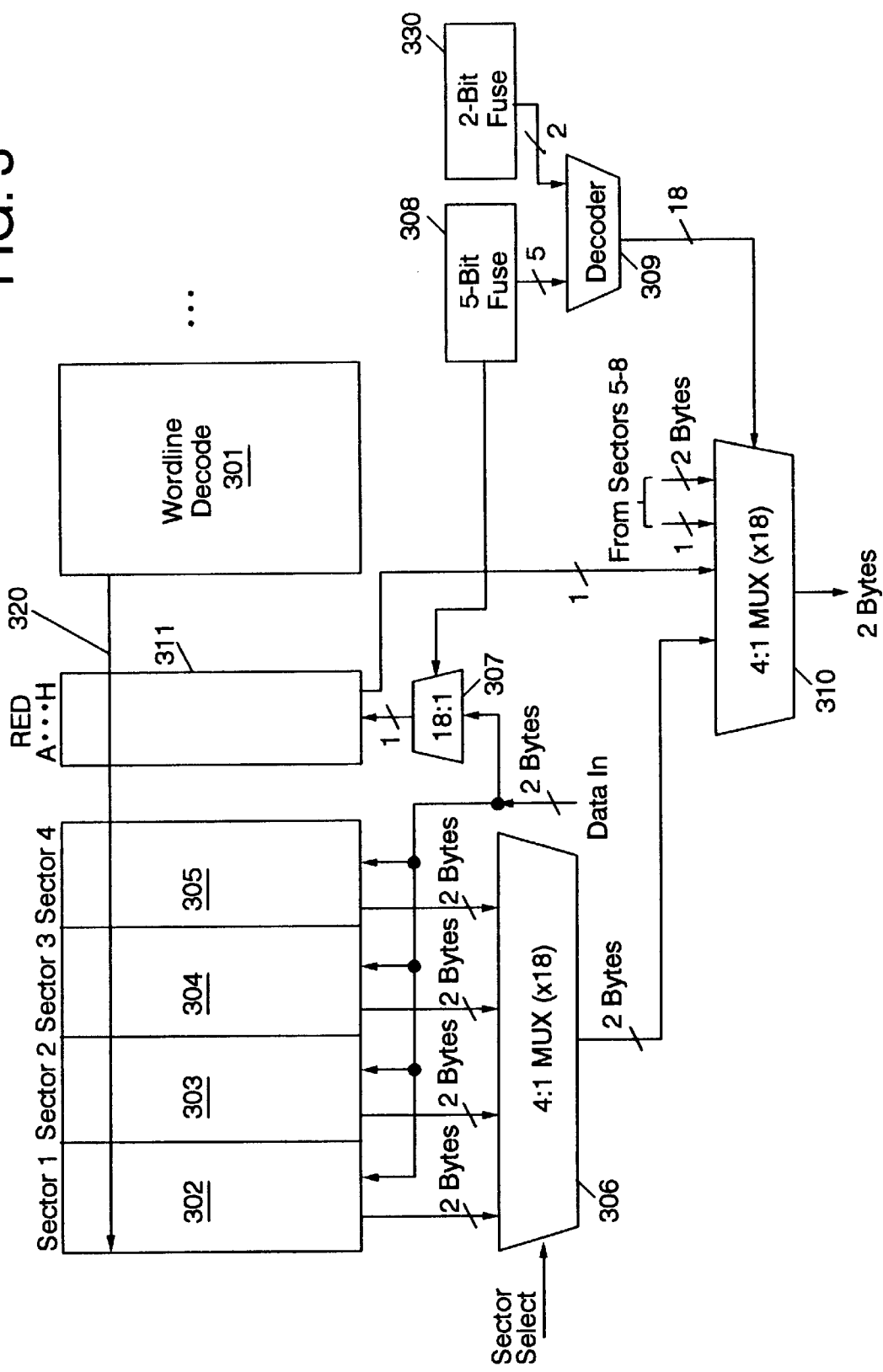
FIG. 3 illustrates an embodiment of the present invention, including a write operation in accordance with the present invention.

Referring next to FIG. 3, there is illustrated a diagram of the present invention, which may be a memory subarray in either of caches 101 or 102. Shown is a portion of a cache, sometimes referred to as a subarray of the entire cache, consisting of eight sectors. Each sector may comprise eight sets of two input/output ("I/O") bytes each. The cache may be a set associative cache.

Figure 4:
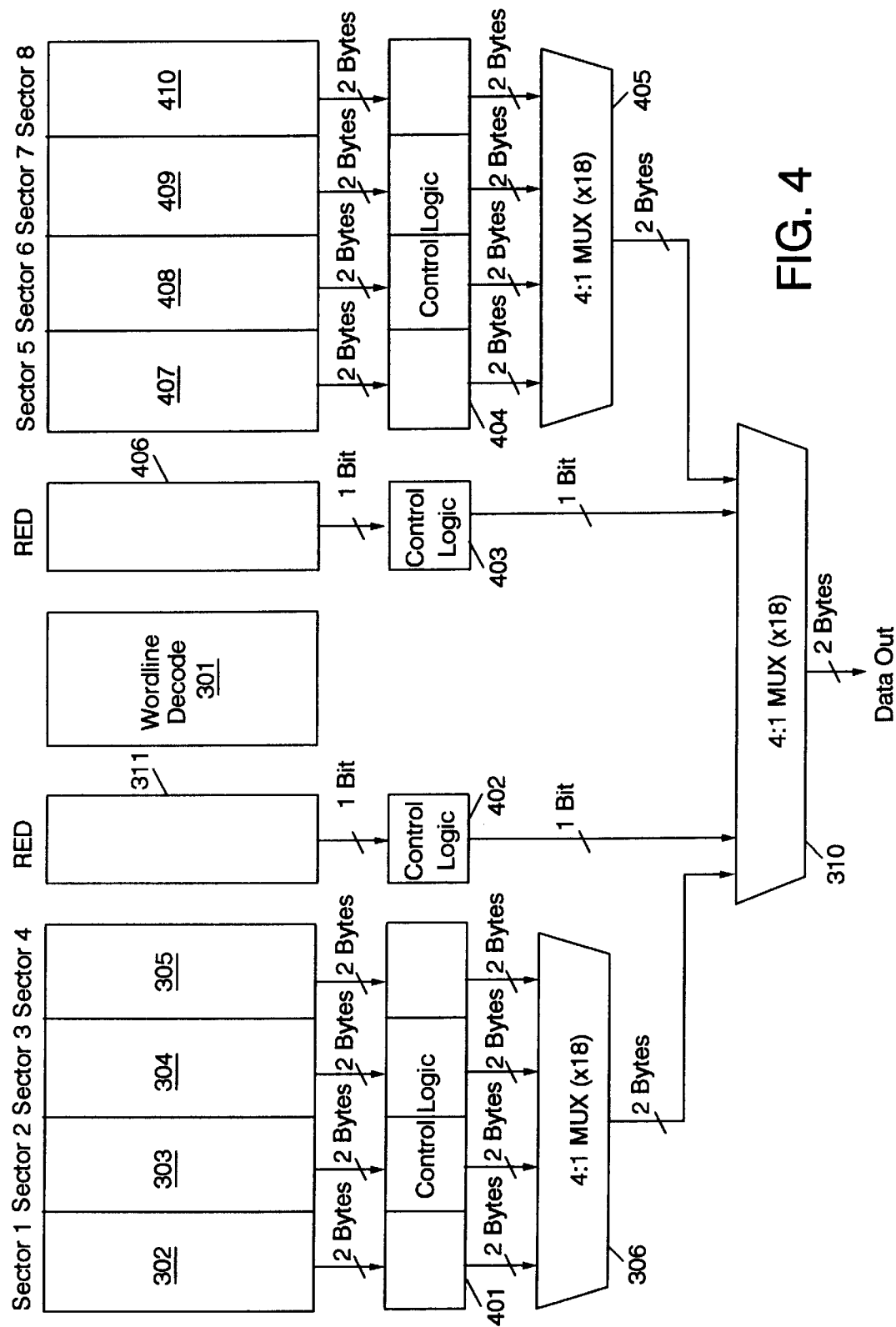
FIG. 4 illustrates a read operation in accordance with the present invention.

Please note that only one half of the subarray is shown in FIG. 3; the full subarray is shown in FIG. 4. Sectors 302–305 are accessed by wordline 320 emanating from wordline decode circuit 301. The column access of sectors 302–305 is performed by control logic 401 shown in FIG. 4, but not shown in FIG. 3 for reasons of clarity. Retrieval of sets of 2 bytes from sectors 302–305 is performed with multiplexer 306 in response to a Sector_Select (row select or block select) signal in a manner well-known in the art. Please note that the 2 bytes retrieved consist of 18 bits (2 bytes plus parity of 2 bits). The selected 2 bytes are then transferred to one of the inputs into multiplexer 310.

The present invention comprises a redundant (RED) portion 311, which may store a bit slice of information. Redundant memory portion 311 is also accessed by wordline 320.

Essentially, redundant portion 311 can replace a bad bit slice found during the testing of the subarray during the manufacturing process or at any other point in time during operation of the cache memory. As an example, the user may discover that bit slice 0 within sector 302 is defective. The user may then program the memory subarray so that the information stored and retrieved from bit slice 0 of sector 1 is also stored and retrieved from redundant portion 311. Such programming may be accomplished with a programmable register(s), which is used instead of fuses 308 and 330 which are discussed in further detail below.

As 2 bytes of data are written into the memory subarray, bit 0 of the 2 bytes is written into both bit slice 0 of sector 302 and into redundant portion 311 through mux 307. The selection of bit slice 0, or whatever bit slice within whatever sector is defective, is performed by the selection of the particular bit slice by multiplexer 307 as a function of N-bit fuse 308 (in this example, N=5). 5-bit fuse 308 may be programmable by the user. As an alternative, 5-bit fuse 308 may be some other programmable means within the memory subarray, such as a programmable register.

As can be noted, the present invention writes data to both the original bit slice and to the redundant memory portion 311, which is different than what is performed in the prior art which typically performs a decoding operation to write the data only to the redundant portion. The present invention requires no such additional decoding logic to "block" the passage of the data to the original slice.

Reading from the memory subarray is performed in a similar manner, whereby both the data in bit slice 0 of sector 302 and the identical information stored within redundant portion 311 are both accessed and entered into multiplexer 310. The decision of which bit slice (bit slice 0 in sector 302 or the redundant information within portion 311) is made by decoding the information from 5-bit fuse 308 and 2-bit fuse 330 (for sector selection) through decoder 309, which makes the selection through multiplexer 310. The entire 2 bytes accessed from the memory subarray are then output from multiplexer 310 along with the bit from redundant portion 311.

Again, the present invention retrieves the information from both the defective memory portion and the redundant memory portion without performing what is typical in the prior art, which is a decoding operation in order to read only the information from the redundant memory portion. An advantage of the present invention is that there is no performance penalty in blocking the "bad" cell. Furthermore, less circuitry is required with the present invention since the decoding circuitry mentioned above in the prior art is not needed, and the present invention requires merely the addition of decoder 309, which is not on the critical path. Thus, there is no added delay in the critical path.

Figure 7:
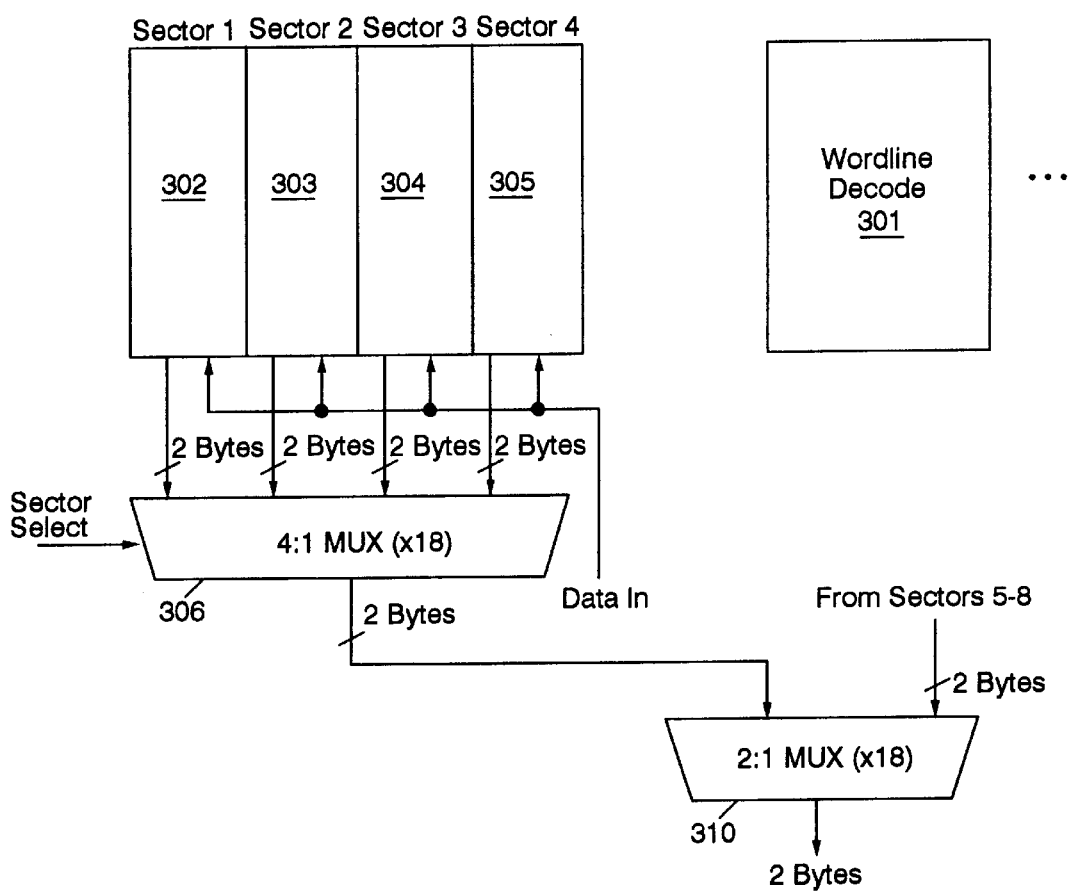
FIG. 7 illustrates an array without implementation of redundancy.

Referring next to FIG. 7, there is illustrated an array similar to the one illustrated in FIG. 3, except that the redundancy of the present invention has not been implemented. Note, this array still utilizes multiplexer 310. There is no added multiplexer in the critical path as has been required in the prior art.

Referring next to FIG. 4, there is illustrated a more complete diagram of the memory subarray shown in FIG. 3 wherein sectors 407–410 (sectors 5–8) are shown along with redundant portion 406 for that side of the memory subarray. Also added is multiplexer 405 which is the equivalent of multiplexer 306.

FIG. 4 illustrates that the present invention also provides redundancy of the control logic associated with each of the sectors. Therefore, the present invention provides a redundant bit slice comprising redundant memory portion 311 and control logic 402, which may include column decoders, sense amps, and data in and data out circuitry. Sectors 302–305 are controlled by control logic 401 while sectors 407–410 are controlled by control logic 404. Furthermore, control logic 402 is associated with redundant section 311 while control logic 403 is associated with redundant section 406. Thus, the present invention not only protects defective bits, but also the supporting circuitry within the bit slice within the control logic portion such as column decoders, sense amps, and data in and data out circuitry.

Figure 8:
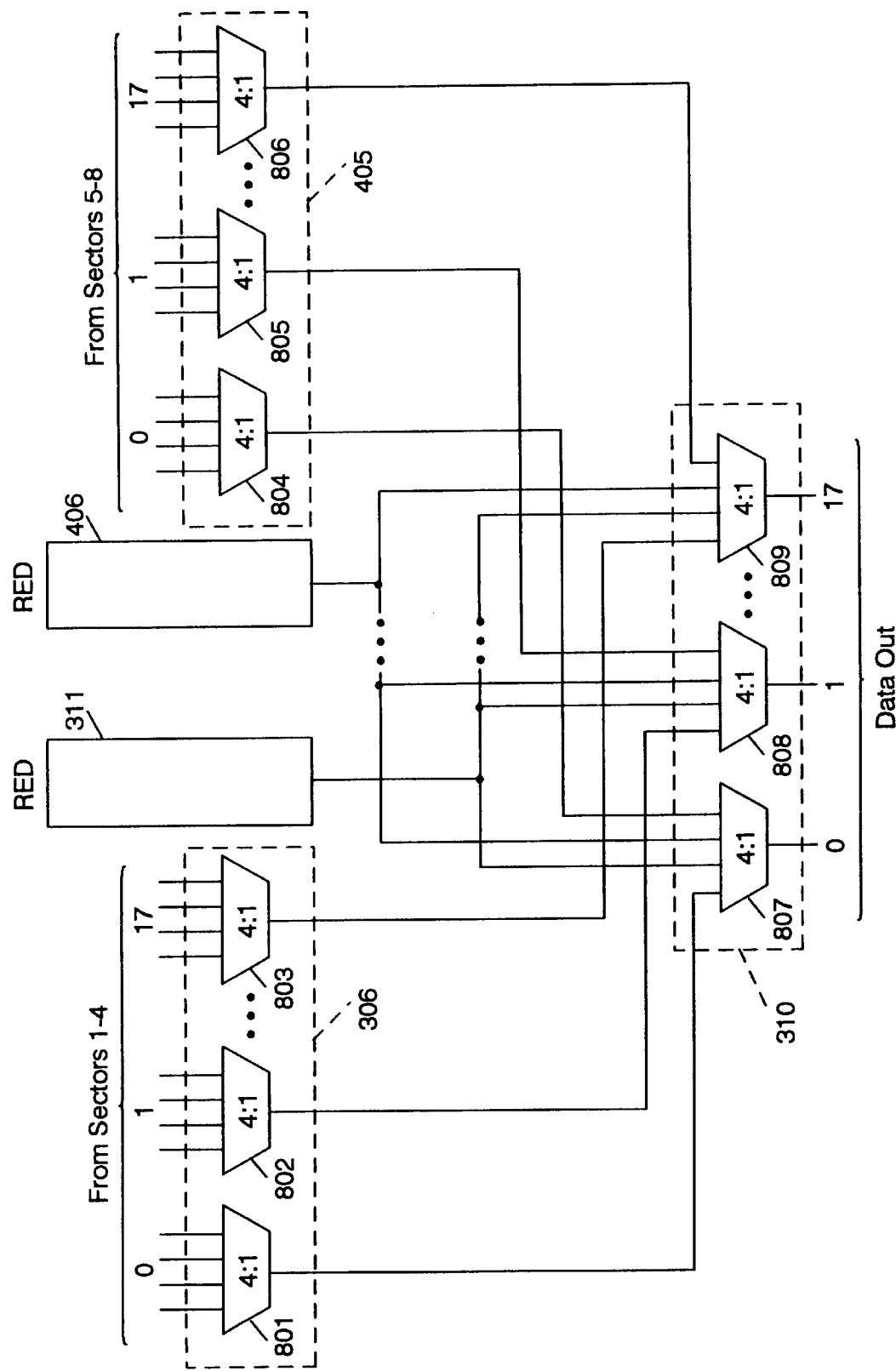
FIG. 8 illustrates an implementation of the present invention.

Referring next to FIG. 8, there is illustrated another depiction of the present invention showing further detail of multiplexers 306, 310, and 405 and the coupling of redundant portions 311 and 406 to multiplexer 310. In order to illustrate these features, other elements, such as the individual sectors 302–305 and 407–410, wordline decoder 301, and control logic circuitry 401–404 have been omitted.

Multiplexer 306 comprises 4:1 muxes 802–803 receiving bits 0 . . . 17 from sectors 1–4. More specifically, each of multiplexers 801–803 receives a bit from each of sectors 1–4. Likewise, multiplexer 405 comprises 4:1 multiplexers 804–806 receiving bits 0 . . . 17 from sectors 5–8.

The outputs of these multiplexers are coupled to corresponding multiplexers 807–809, which are 4:1 multiplexers within multiplexer 310. Multiplexers 807–809 output bits 0 . . . 17 as Data Out.

Note that the outputs from redundant portions 311 and 406 are received by each of multiplexers 807–809. This utilizes a traditional multiplexer circuit (see FIG. 5) in a unique approach. This unique approach allows the redundant path to add only a few pico seconds to the normal critical path while allowing for normal decoding to occur. Note that by having redundant element 311 send its data path to all of multiplexers 807–809, there is more capacitive load on its output than on the output of multiplexers 306 and 405. However, the signals from redundant memory portions 311 and 406 receive the word line signal before the rest of the array (see FIGS. 3 and 4). Therefore, the bitline signal development starts first in the redundant elements and is last in sectors 1 and 8. Since the signal development starts first, the sense amp will be set first causing the redundant signal to leave its control logic section 402 and 403 first. This adds almost no delay to sectors 1 and 8. However, these two sectors are the performance gate in the critical path since they are at the end of the wordlines. Secondly, because the redundancy was included in multiplexer 310, and not multiplexers 306 and 405, the regular path has an additional multiplexer delay in its path that the redundancy data does not have in its delay path. These two factors allow the redundant path to not be in the critical timing path even though the capacitive load and RC path is large from the output of the control logic to multiplexer 310.

Note that the present embodiment has many variations. For instance, the final multiplexer 310 is not limited in application to a 4:1 structure. It can vary dependent on the decoding necessary and the redundancy desired. For instance, only 1 redundancy element could have been used, i.e. redundant portion 311 only, or 4 redundant elements could have been used. Likewise, redundant element 311 may replace any bit slice within sectors 1–4, and redundant portion 406 may replace any one of the bit slices within sectors 5–8. Finally, there could have been 4 or 8 multiplexers feeding multiplexer 310 rather than just 2.

Figure 2:
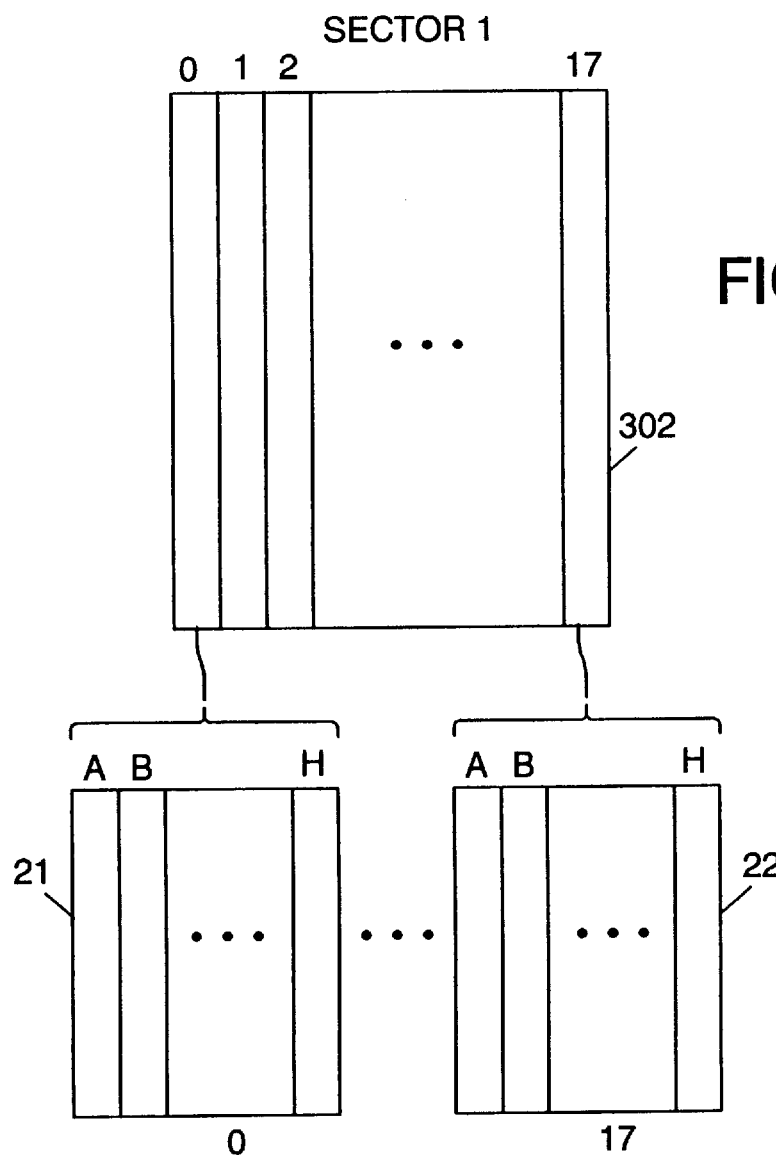
FIG. 2 illustrates one example of a sector of memory configured in accordance with the present invention.

Referring next to FIG. 2, there is illustrated a more detail diagram of sector 302 and bit slices 21–22 (0–17). This shows that bit slice 0 includes bit 0 slices of sets A–H.

Figure 5:
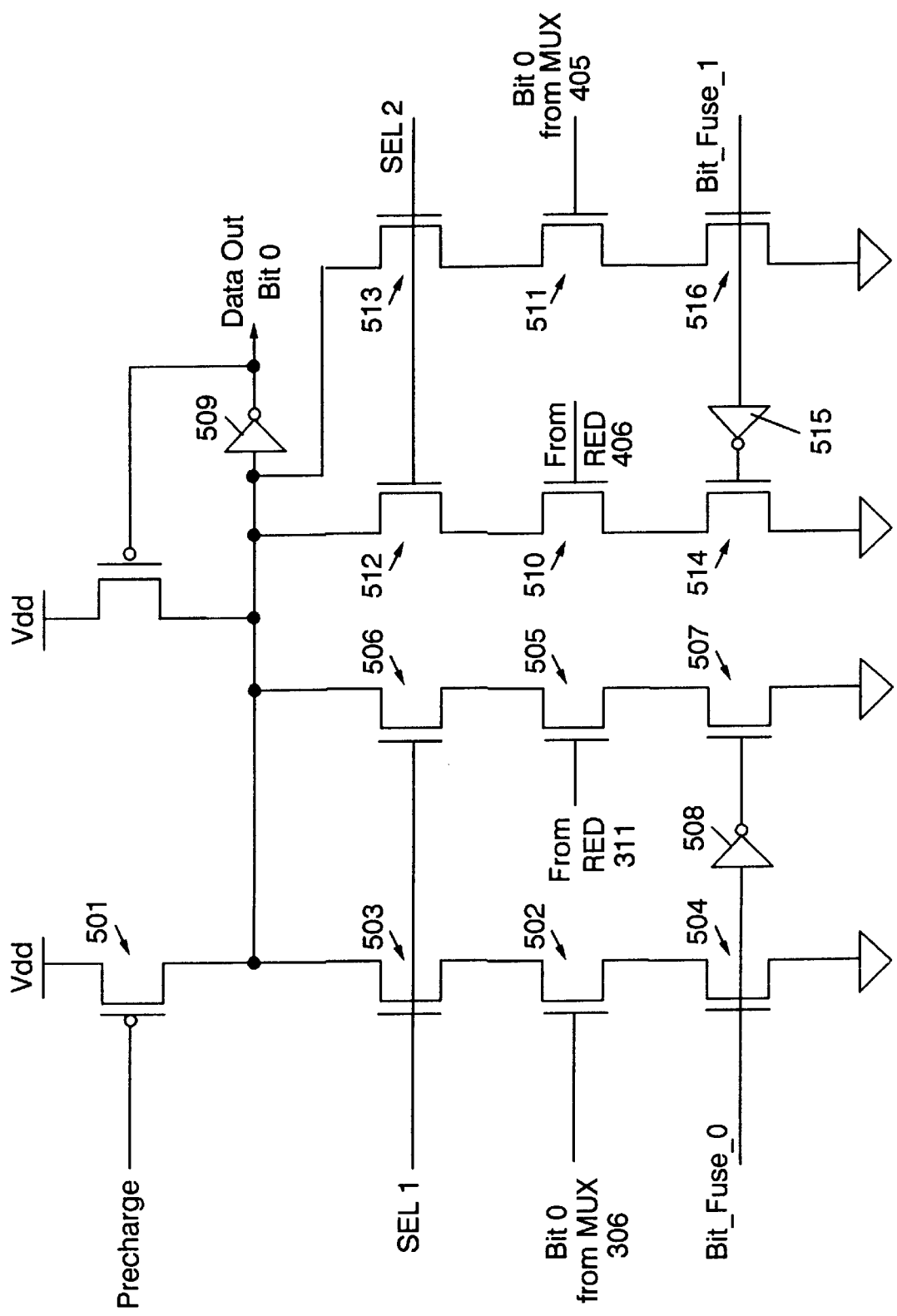
FIG. 5 illustrates a detailed circuit diagram of a multiplexer utilized within the present invention.

Referring next to FIG. 5, there is illustrated a more detailed diagram of a portion of multiplexer 310. The shown multiplexer circuitry is quite typical in the art and includes PFET 501 and NFETs 502–507, along with inverters 508 and 509. Essentially, selection of the 2 bytes from multiplexer 306 is performed by signal SEL__1 into NFETs 503 and 506. Devices 510–516 correspond to the other half of the subarray, which is shown in FIG. 4. NFET 510 receives bit 0 from that half's redundant portion 406 while NFET 511 receives bit 0 from multiplexer 405. Further discussion of these devices is not done for reasons of clarity.

Continuing the example described above with respect to FIG. 3 whereby bit slice 0 is defective and the information stored therein is copied within redundant portion 311, bit 0 from multiplexer 306 is received by NFET 502 while bit 0 stored within redundant portion 311 is received by NFET 505. The determination of which of the signals into NFETs 502 and 505 is output through inverter 509 is made by the signal bit__fuse__0, which is received by NFET 504, and inverted by inverter 508 and then received by NFET 507. Depending on the value of this signal bit__fuse__0, one of the two signals received by NFETs 502 and 505 will be output.

Figure 6:
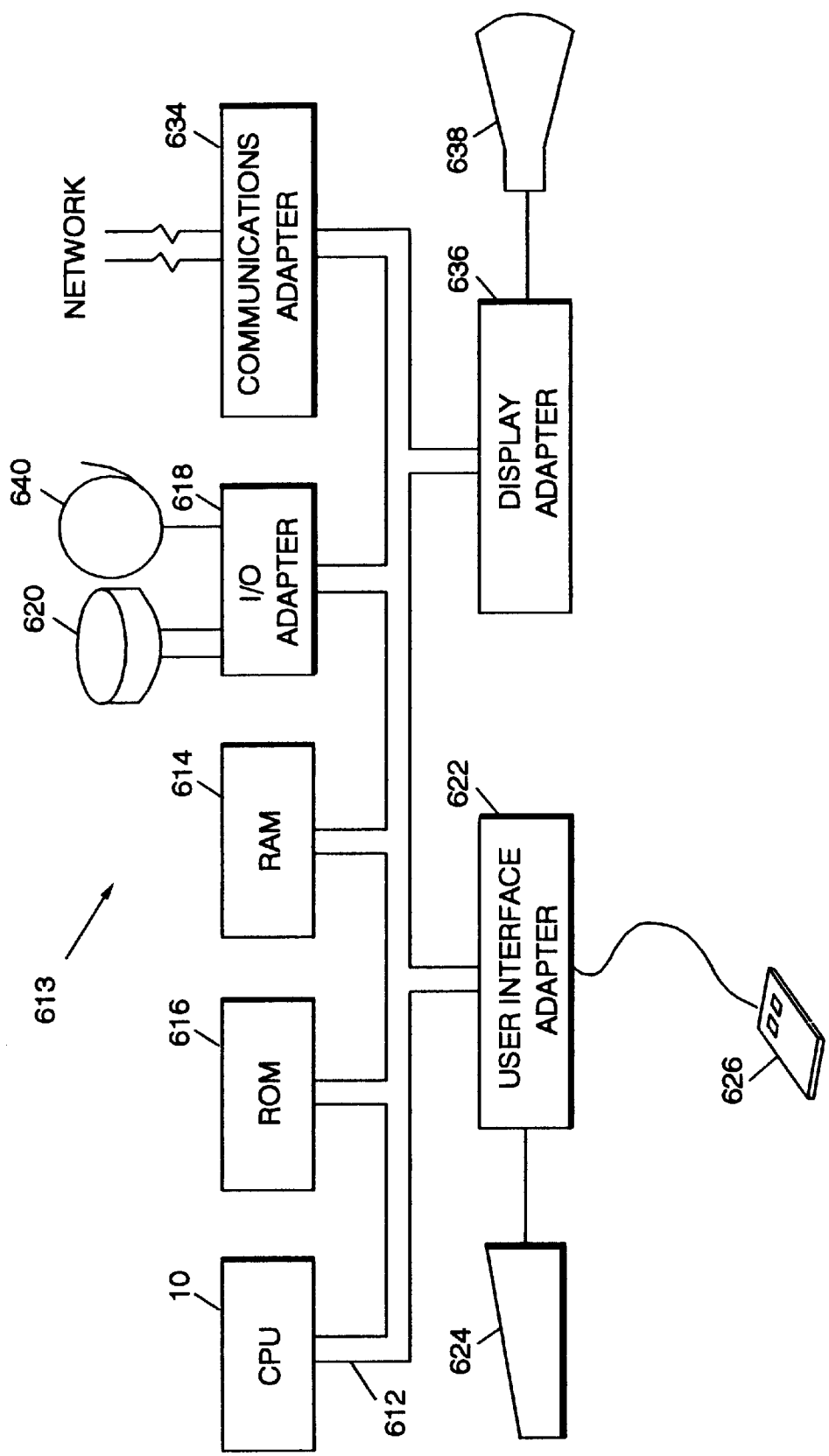
FIG. 6 illustrates a data processing system configured in accordance with the present invention.

A representative hardware environment for practicing the present invention is depicted in FIG. 6, which illustrates a typical hardware configuration of a workstation or personal computer in accordance with the subject invention having chip 610, including conventional microprocessor 100, and a number of other units interconnected via system bus 612. The workstation shown in FIG. 6 includes random access memory (RAM) 614, read only memory (ROM) 616, and input/output (I/O) adapter 618 for connecting peripheral devices such as disk units 620 and tape drives 640 to bus 612, user interface adapter 622 for connecting keyboard 624, mouse 626, and/or other user interface devices such as a touch screen device (not shown) to bus 612, communication adapter 634 for connecting the workstation to a data processing network, and display adapter 636 for connecting bus 612 to display device 638. CPU 100 may include other circuitry not shown herein, which will include circuitry commonly found within a microprocessor, e.g., execution unit, bus interface unit, arithmetic logic unit, etc.

Although the present invention and its advantages have been described in detail, it should be understood that various changes, substitutions and alterations can be made herein without departing from the spirit and scope of the invention as defined by the appended claims.

What is claimed is:

1. A memory circuit comprising:

a first memory portion operable for storing information;

a second memory portion operable for storing an identical copy of said information;

circuitry for writing said information into both of said first and second memory portions;

a wordline decoder operable for simultaneously selecting both of said first and second memory portions m one wordline;

circuitry for selectively reading said information from either said first memory portion or said second memory portion, wherein said selectively reading circuitry further comprises a multiplexer receiving said information from said first memory portion and receiving said identical copy of said information from said second memory portion, wherein selection of said information or said identical copy of said information is a function of a programmable circuit coupled to said multiplexer.

2. The memory circuit as recited in claim 1, wherein said memory circuit is a single memory circuit residing on a single chip.

3. The memory circuit as recited in claim 2, wherein said first and second memory portions store a bit slice of one or more bytes of said information.

4. The memory circuit as recited in claim 3, wherein said memory circuit is a set associative cache memory device.

5. The memory circuit as recited in claim 1, wherein said memory circuit is a cache memory.

6. The memory circuit as recited in claim 1, wherein said programmable circuit includes one or more fuses.

7. The memory circuit as recited in claim 6, wherein said one or more fuses are programmed to select said identical copy of said information when said first memory portion is defective.

8. The memory circuit as recited in claim 1, wherein said programmable circuit includes a programmable register.

9. The memory circuit as recited in claim 1, wherein only one level of multiplexers is required to output said information from said second memory portion.

10. The memory circuit as recited in claim 9, wherein the second memory portion is a redundant array.

11. An integrated circuit including a cache memory device, comprising:

a first memory portion operable for storing information;

a second memory portion operable for storing an identical copy of said information, wherein said first and second memory portions store a bit slice of one or more bytes of said information;

circuitry for writing said information into both of said first and second memory portion;

a wordline decoder operable for simultaneously selecting both of said first and second memory portion with one wordline;

circuitry for selectively reading said information from either said first memory portion or said second memory portion, wherein selectively reading circuitry further comprises:

a multiplexer receiving said information from said first memory portion and receiving said identical copy of said information from said second memory portion, wherein selection of said information or said identical copy of said information is a function of a programmable circuit coupled to said multiplexer.

12. The integrated circuit as recited in claim 11, wherein said programmable circuit includes one or more fuses.

13. The integrated circuit as recited in claim 12, wherein said multiplexer comprises a plurality of multiplexers each receiving a bit from said first memory portion, and wherein said each of said plurality of multiplexers also receives input from said second memory portion.

14. The integrated circuit as recited in claim 11, wherein said second memory portion includes:

a plurality of memory cells making up a plurality of bitlines;

at least one column decoder coupled to said plurality of memory cells;

at least one sense amp coupled to said plurality of memory cells; and write circuitry coupled to said plurality of memory cells.

15. The integrated circuit as recited in claim 11, wherein only one level of multiplexers is required to output said information from said second memory portion.

16. The integrated circuit as recited in claim 15, wherein the second memory portion is a redundant array.

17. The integrated circuit as recited in claim 11, further comprising a processor coupled to said cache memory device.

18. A method for storing and retrieving information in a memory circuit, said method comprising the steps of:

writing said information into both of first and second memory portions, wherein said second memory portion is operable for storing an identical copy of said information;

simultaneously selecting both of said first and second memory portion with one wordline;

selectively reading said information from either said first memory portion or said second memory portion, wherein said selectively reading step further comprises the steps of:

receiving into a multiplexer said information from said first memory portion and said identical copy of said information from said second memory portion; and selecting for output from said multiplexer said information or said identical copy of said information as a function of a programmable circuit coupled to said multiplexer.

19. The method as recited in claim 18, wherein said first and second memory portions store a bit slice of one or more bytes of said information, wherein said memory circuit is a set associative cache memory device.

20. The method as recited in claim 18, wherein said programmable circuit includes one or more fuses.

* * * * *

UNITED STATES PATENT AND TRADEMARK OFFICE
CERTIFICATE OF CORRECTION

PATENT NO. : 5,953,745
DATED : September 14, 1999
INVENTOR(S) : George McNeil Lattimore; Terry Lee Leasure; Gus Wai-Yan Yeung It is certified that error appears in the above-identified patent and that said Letters Patent is hereby corrected as shown below:

Column 7, Line 18 after "portions", replace "m" with --with--.
Column 7, Line 63, "portion", should be --portions--.
Column 8, Line 3 after "wherein", insert --said--.
Column 8, Line 45, "portion", should be--portions--.

Signed and Sealed this

Twenty-ninth Day of May, 2001

Attest:

NICHOLAS P. GODICI

Attesting Officer                Acting Director of the United States Patent and Trademark Office